May 30, 1967 E. FRÖSCHLE 3,323,028

HIGH FREQUENCY PNIP TRANSISTOR STRUCTURE

Filed Aug. 7, 1961 3 Sheets-Sheet 1

INVENTOR
Ernst Fröschle

BY George H. Spencer
ATTORNEY

INVENTOR
Ernst Fröschle
BY George H. Spencer
ATTORNEY

INVENTOR
Ernst Fröschle

BY George H Spencer
ATTORNEY

1

3,323,028
HIGH FREQUENCY PNIP TRANSISTOR STRUCTURE

Ernst Fröschle, Ulm (Danube), Germany, assignor to Telefunken Patentverwertungs-G.m.b.H., Ulm (Danube), Germany Filed Aug. 7, 1961, Ser. No. 129,714
Claims priority, application Germany, Aug. 5, 1960, T 18,796
8 Claims. (Cl. 317—235)

The present invention relates generally to semiconductor devices and, more particularly, to a transistor, with a semiconductor body of the collector zone type conductivity wherein the semiconductor body is provided with a base zone and an emitter zone. Generally the base zone and the emitter zone are brought into the semiconductor body, for example, by alloying or by a diffusion process.

Within this category of semiconductor devices is included the diffused base transistor wherein the base zone is diffused into the collector body. In such a device, the emitter zone may also be produced by diffusion or, for example, by the alloying process.

A main object of this invention is to provide a semiconductor device with small collector capacitance having small collector transit times and high current densities without the disadvantage of a space charge limited emission.

Another object of the present invention is to provide processes for making such semiconductor devices.

These objects and others ancillary thereto are accomplished according to preferred embodiments of the invention, wherein a high resistance or intrinsic conduction zone is provided between the base zone and the collector zone and the width of this high resistance or intrinsic conduction zone is non-uniform or varied.

Preferably, the variation in thickness uniformity of the high resistance or intrinsic conduction zone is arranged so that the portion of the high resistance or intrinsic conduction zone opposite the emitter zone or the effective or active portion of the emitter zone is of relatively small thickness, while the entire remaining high resistance or intrinsic conduction zone or at least a portion thereof is greater in thickness.

The effective or active portion of the emitter zone, also called the emission region, is present in semiconductor tetrodes, for example, and refers to the fact that only a portion of the emitter zone emits due to a longitudinal electrical field existing in the base zone.

When the high resistance or intrinsic conduction zone is thinner at the point opposite the emitter zone or opposite the active portion of the emitter zone, small collector transit times and high current densities are achieved without a space charge limited emission occurring. Also, the collector capacitances assume smaller values if the remaining regions of the high resistance or intrinsic conduction zone not opposite the emission region are relatively large in thickness.

In this context it is pointed out that using thickness dimensions just the opposite of those discussed above offers advantages for certain applications.

In the preceding discussion, a high resistance intermediate zone has already been mentioned. This means that the intermediate zone may be weakly n-doped or p-doped if this is more easily accomplished from a technological point of view. It is advisable, however, to choose the n-doping of the high resistance intermediate zone only so high that, at least in the emission region, the space charge zone of the p-n junction on the collector side extends over the entire width of the high resistance zone if the lowest operating voltage provided is applied between collector and base.

2

The smallest resistance losses and at the same time feedback capacitances and output capacitances independent of voltage are obtained if the high resistance intermediate zone is so weakly doped that, even in the thicker portions of the high resistance intermediate zone, the space charge zone of the collector blocking layer extends through the entire high resistance zone; that is, from the highly doped region of the base zone to the highly doped region of the collector zone, the latter is permeated with an impurity of, for example, $10^{18}$ to $10^{20}$ per cc. In order to avoid surface breakthroughs, it is advisable to design the high resistance intermediate zone thicker in the region of the surface than in the emission region.

Additional objects and advantages of the present invention will become apparent upon consideration of the following description when taken in conjunction with the accompanying drawings in which.

Figure 1:
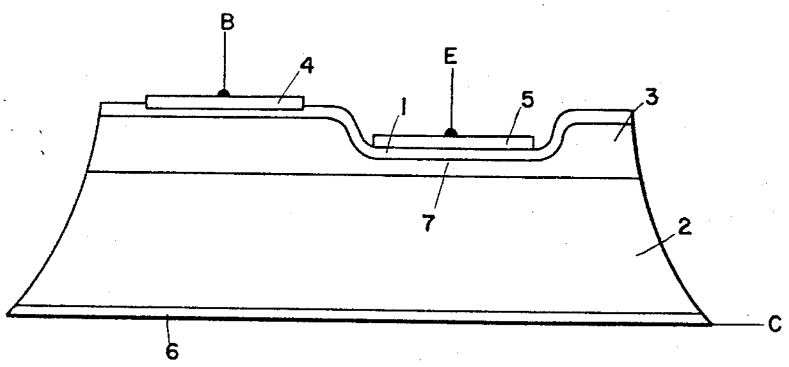
FIGURE 1 is a diagrammatic side view of a three electrode mesa transistor.

With more particular reference to the drawings, FIGURE 1 shows a mesa transistor wherein a high resistance or intrinsic conduction zone 3 is provided between the base zone 1 and the collector zone 2. The base electrode 4 and the emitter electrode 5 are arranged on one surface of the semiconductor body while the collector zone 2 is provided with an ohmic contact by the electrode 6 alloyed to the opposite side of the body. The high resistance or intrinsic conduction zone 3 is thicker outside of the region opposite the emitter zone 5 than at the point opposite the emitter zone.

Figure 2:
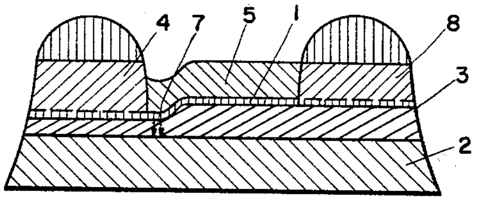
FIGURE 2 is a diagrammatic sectional view of a tetrode mesa transistor.

FIGURE 2 also shows a mesa transistor which is of the tetrode type. Two electrodes are alloyed to the semiconductor body on the emitter side to form the tetrode. These electrodes are a base auxiliary electrode 8 and a base control electrode 4. The emitter zone 5 lies between these two base electrodes and is disposed next to a narrow base zone 1.

The base zone 1 does not border directly on the collector zone 2 but is separated therefrom by a high resistance or intrinsic conduction zone 3 which is smaller in thickness at the emission region 7 than in the remaining region of the high resistance or intrinsic conduction zone 3 disposed to the right of the emission region in FIGURE 2.

Figure 3:
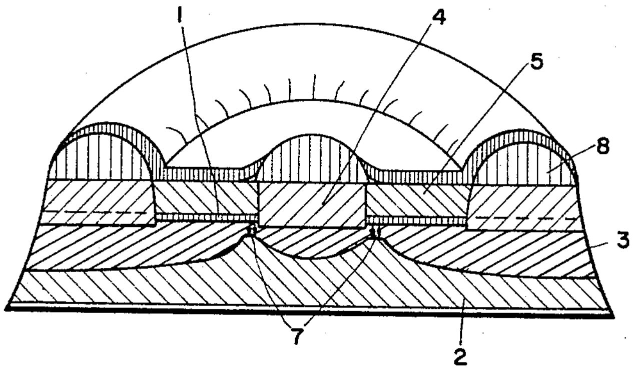
FIGURE 3 is a diagrammatic perspective view, partly in section, of another type of tetrode mesa transistor.

FIGURE 3 shows another embodiment of a mesa tetrode wherein the base auxiliary electrode 8 is in the form of a ring which surrounds the base control electrode 4. In this embodiment, the emitter zone 5 surrounds the base control electrode 4 and is separated from the high resistance or intrinsic conduction zone by the thin base zone 1. Due to a longitudinal electric field existing in the base zone, the emission again takes place only in a portion of the emitter zone which directly borders on the base control electrode 4. The high resistance or intrinsic conduction zone 3 is small in thickness at the active emissive regions 7 while, compared thereto, the width of the intrinsic conduction zone increases considerably outwardly of the emission region. The collector zone is contacted by an electrode providing an ohmic contact.

In the manufacture of such mesa devices with a high resistance or intrinsic conduction zone between the base zone and the collector zone, the production of the starting body is of special importance. It comprises two zones bordering one another. One of these zones is relatively thin and so chosen with regard to its doping that it can take on the function of the high resistance or intrinsic conduction intermediate zone. The substantially wider zone bordering on this zone is very strongly doped with impurities having the conductivity type of the collector zone of the transistor.

Such a starting body, comprising a semiconductor body which is very strongly doped and which has a thin, weakly doped or intrinsic conduction surface zone on one side, about 10 microns thick, is obtained, for example, by deposing weakly doped semiconductor material onto a strongly doped semiconductor body. This deposition may be carried out, for example, by thermal decomposition of semiconductor halogenides according to known processes.

Figure 4:
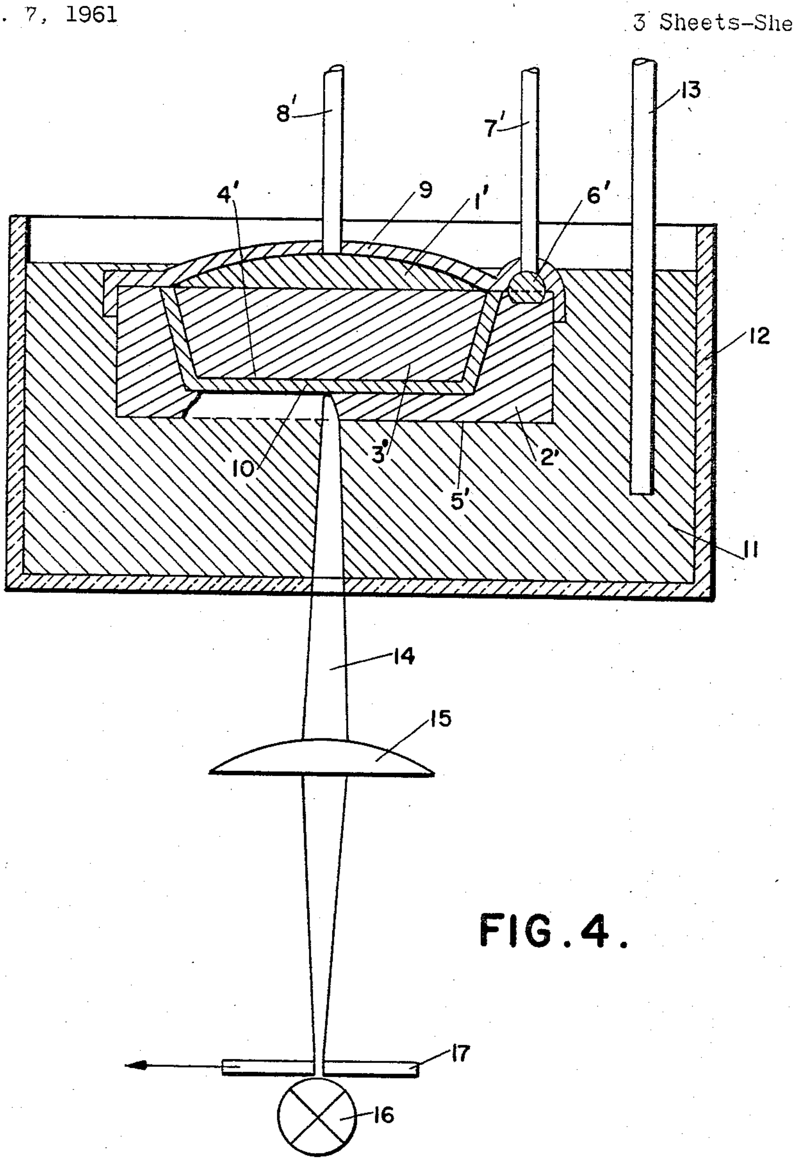
FIGURE 4 illustrates a self-limiting etching process, by which a semiconductor body with a high resistance zone of equal width and a bordering zone of opposite conductivity type is obtained.

FIGURE 4 illustrates a method by which the starting body may also be produced. According to this method the starting body is produced by alloying an electrode 1′ having a large area extending nearly over the entire semiconductor body 2′. This may be done, according to the method used for power rectifiers, with a semiconductor body of relatively large thickness and having an impurity concentration corresponding to the weak doping of the surface zone.

The conductivity type of the alloying electrode 1′ is opposite to the conductivity type of the semiconductor body 2′. In the case of a weakly n-doped semiconductor body 2′, for example, indium can be used as alloy material. The alloying temperature for indium is about 550–600° C.

At the alloying process the alloying and cooling conditions are chosen so that the alloying front 4′ has as plane a shape as possible relative to the basic material and that the alloyed zone 3′ is as thick as possible. Moreover, the distance between the alloying front 4′ and the opposing semiconductor surface 5′ should not be too great.

In the case of an n-conductive base zone, an n-doping auxiliary base contact 6′ is alloyed at the edge of the semiconductor body. Both this auxiliary base contact 6′ and the alloying electrode 1′ are provided with lead wires 7′ and 8′ and covered with a suitable insulating varnish 9. The uncovered side of the semiconductor body 2′ thus treated is then etched according to a self-limiting electrolytic etching process. During etching, a negative voltage lies between the rear side electrode 1′ and the auxiliary contact 6′ so that a blocking layer 10 is formed at the alloying front 4′. The thickness of this layer depends upon the doping of the n-material and the voltage at the rear side contact 1′. The electrolyte 11, for example, a solution consisting of 95% $H_2O$ and 5% NaOH, is in the transparent etching container 12. A voltage is likewise applied between electrolyte 11 and auxiliary contact 6′ which voltage is also negative, but smaller than the voltage lying between the rear side electrode 1′ and the auxiliary contact 6′. The potential of the rear side electrode 1′ can be, for example, −15 volt if −5 volt is the potential of the electrolyte electrode 13. In this case the auxiliary contact 6′ lies on zero potential.

A beam of light 14 is projected through a lense 15, the container 12 and through the electrolyte 11 onto the semiconductor body to be etched by a strong source of light 16. This beam of light 14 is about 100 microns wide and extends perpendicular to the drawing plane over the entire semiconductor surface. During the etching process the beam of light 14 is slowly moved over the semiconductor body at right angles to its longitudinal direction, for example, by moving of a slit 17.

At the exposed points, the semiconductor material, germanium in the embodiment, is quickly etched off. The etching stops automatically when the rear side blocking layer 10 has been reached.

After etching the strongly doped starting body is provided with a thin high resistance or intrinsic conduction surface zone, the thickness of which corresponds to the width of the blocking layer 10. The indentations or points of less width of the high resistance or intrinsic conduction zone necessary according to the invention and present in the emission region in the devices according to FIGURES 1 to 3 may be obtained, for example, by localized etching. Suitable for this purpose is, for example, the photolithographic technique wherein the areas not to be etched are covered before etching with photo-sensitive varnish.

However, consideration must be given to the fact that, in general, the difference between the width of the high resistance or intrinsic conduction zone in the emission region and the remaining width of this zone is very considerable. It is advantageous to make the width of the high resistance or intrinsic conduction zone in the emission region less than one-half the remaining zone thickness. Frequently, it is advisable to make the high resistance or intrinsic conduction zone even thinner in the emission region, for example, 1–3 microns thick, so that its thickness at this point amounts to only one-third or even less of the remaining zone thickness. With this result in mind, it has proved advantageous to use self-limiting etching methods which automatically interrupt or terminate the etching process after the desired zone thickness has been reached.

Such an etching process requires the existence of a space charge barrier and by this the existence of a pn-junction. As known the width of the space charge barrier can be varied by the value of the junction bias. The etching process is stopped when the semiconductor body is etched off as far as to the space charge barrier. The required pn-junction results, as already described, for example, by alloying an alloying zone into a weekly doped semiconductor body.

Figure 5:
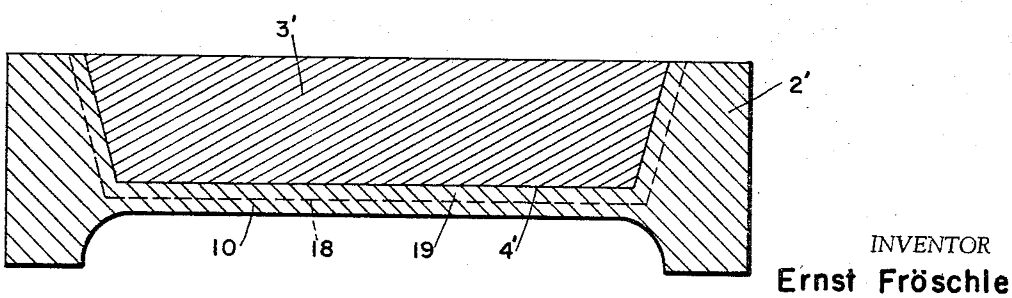
FIGURE 5 is a sectional view of the semiconductor body achieved by the self-limiting etching process in connection with FIGURE 4.

FIGURE 5 shows a semiconductor body 2′ which is produced by the etching process already described and which consists of two zones of opposite conductivity type. The p-doped zone 3′ was made by the alloying process. In front of the alloying zone 3′ is a thin weakly n-doped zone 10. The width of this zone 10 corresponds to the width of the space charge barrier existing during the etching process.

As FIGURE 5 shows, the weakly n-doped zone 10 has still equal width after the described etching process. The process now to be described serves the purpose to get the required thinning at the emitting region according to the invention. The variation of the width of the weakly doped zone, for example, may be achieved by the well known photolithographic technique wherein the areas not to be etched are covered before etching with photo-sensitive varnish.

The variation of the width of the weakly doped zone, however, can also be achieved by a self-limiting etching process as described in connection with FIGURE 4. For achieving the variation the pn-junction 19 existing between the alloying zone 3′ and the weakly doped zone 10 is biased so that the space charge barrier extends from the alloying front 4′ to the dotted line 18. The dotted line 18 corresponds to the thinnest parts of the weakly doped zone 10. At the described etching process only those parts of the weakly doped zone will be illuminated. By this limited illumination an etching process results only at the illuminated spots. It is also possible firstly to etch the thinnest parts of the weakly doped zone 10, as described above, and then etching off the remaining parts according to the greater width. This can be done, for example, by a process as described in connection with FIGURE 4.

Figure 6:
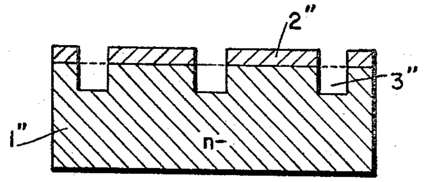
FIGURES 6, 7 and 8 illustrate a process, by which in connection with a temperature gradient melting process a semiconductor body with a high resistance zone of different width may be achieved.

FIGURE 6 illustrates another process, by which the variation of the width of the weakly doped zone according to the invention may be achieved. The starting body consists of a weakly n-doped semiconductor body 1″ which at first is covered with photo-sensitive varnish 2″ at those points of the semiconductor surface which are not to be etched. By the etching process indentations 3″ result at the uncovered spots. The depth of these etching indentations corresponds to the difference between the maximal and minimal weakly doped zone.

Figure 7:
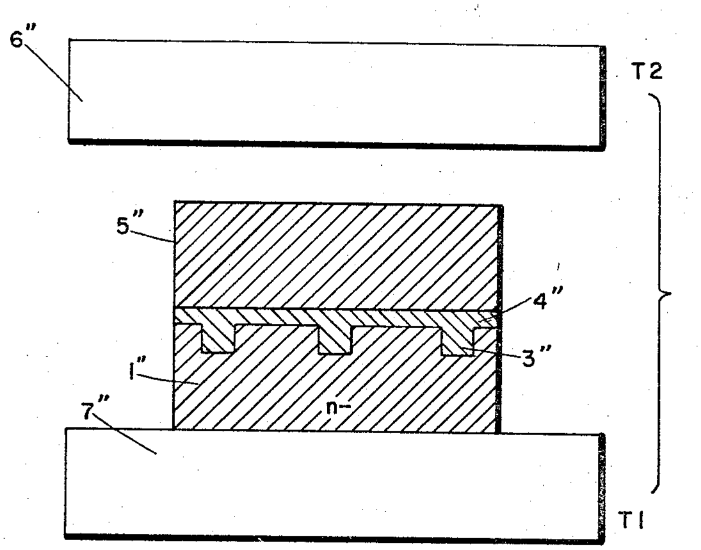
Figure 8:
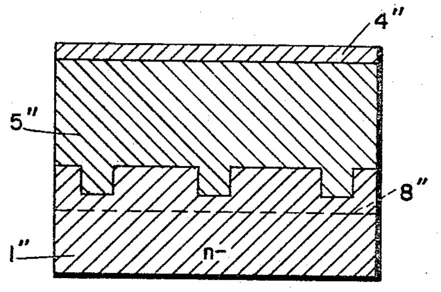

As FIGURE 7 shows, after production of the etching indentations a p-doping alloying substance 4″ is deposited onto this semiconductor surface which is provided with the etching indentations. The alloying substance is deposited onto the semiconductor surface so that the etching indentations 3″ are filled with alloying material and besides the whole semiconductor surface is covered with alloying material. Onto this metallized surface another semiconductor body 5″ is deposited the conductivity type of which may be both p- and n-type. The heaters 6″ and 7″ are heated so that such a temperature gradient results in the semiconductor bodies that the temperature increases from the semiconductor body 1″ to the semiconductor body 5″. This alloying process in literature is known as "temperature gradient melting." The temperature gradient effects at suitable temperatures a travelling of the melted p-doping alloying substance 4″ through the semiconductor body 5″. By this travelling a strongly p-doped zone 5″ results in the semiconductor crystal which is fused by the heating process to a single semiconductor body shown in FIGURE 8. For achieving the required width of the weakly doped zone a part of the semiconductor body 1″ of FIGURE 8 which has been produced by the temperature gradient melting process is removed until the dotted line 8″, for instance, by etching or lapping.

These semiconductor bodies provided with high resistance or intrinsic conduction zones of variable thickness may now be provided, according to known processes, with a base zone and corresponding electrodes for producing a transistor. Thus, for example, the base zone may be produced by diffusion and the emitter zone by alloying aluminium strips with the use of germanium semiconductor bodies, while after the base contacts have been put on and after the mesa etching has been carried out, the collector zone already present is given an ohmic contact.

It will be understood that the above description of the present invention is susceptible to various modifications, changes and adaptations, and the same are intended to be comprehended within the meaning and range of equivalents of the appended claims.

What is claimed is:

1. A semiconductor device comprising, in combination: a semiconductor body of a first conductivity type having a collector zone extending across the entire cross section of said body and a high resistance, intrinsic conduction zone of non-uniform thickness extending into one surface of said body and contiguous with said collector zone; a semiconductor base zone of the opposite conductivity type from said body and extending into said one surface of said body to be contiguous with said intrinsic conduction zone, said base zone having at least one portion disposed adjacent a region of reduced thickness of said intrinsic conduction zone and at least another portion disposed adjacent a region of said intrinsic conduction zone removed from said region of reduced thickness; and a semiconductor emitter zone of the same conductivity type as said body and forming a junction with said base zone, at least the emission region of said emitter zone being disposed adjacent said region of reduced thickness of said intrinsic conduction zone.

2. A semiconductor device according to claim 1, wherein said intrinsic conduction zone is thicker in the region surrounding said emitter zone than in the emission region of said emitter zone.

3. A semiconductor device according to claim 1, wherein said high resistance zone is sufficiently weakly doped that in the operating state at least in the emission region of said emitter zone the space charge zone of the junction between said intrinsic conduction zone and the remainder of said body extends through the entire thickness of said high resistance zone.

4. A semiconductor device according to claim 1, wherein said collector zone of said semiconductor body is very strongly doped to provide said collector zone with a small series resistance.

5. A semiconductor device according to claim 2, wherein said high resistance zone is sufficiently weakly doped that in the operating state at least in the emission region of said emitter zone the space charge zone of the junction between said intrinsic conduction zone and the remainder of said body extends through the entire thickness of said high resistance zone.

6. A semiconductor device according to claim 2, wherein said collector zone of said semiconductor body is very strongly doped to provide said collector zone with a small series resistance.

7. A semiconductor device according to claim 3, wherein said collector zone of said semiconductor body is very strongly doped to provide said collector zone with a small series resistance.

8. A semiconductor device according to claim 5, wherein said collector zone of said semiconductor body is very strongly doped to provide said collector zone with a small series resistance.

References Cited

UNITED STATES PATENTS

| | | | |
|---|---|---|---|
| Re. 24,872 | 9/1960 | Early | 317—235 |
| 2,840,497 | 6/1958 | Longini | 148—1.5 |
| 2,921,362 | 1/1960 | Nomura | 29—25.3 |
| 2,947,923 | 8/1960 | Pardue | 317—235 |
| 3,023,153 | 2/1962 | Kurshan | 204—143 |
| 3,059,124 | 10/1962 | Fuller | 307—88.5 |
| 3,065,392 | 11/1962 | Pankove | 317—235 |
| 3,067,114 | 12/1962 | Tiley et al. | 204—143 |
| 3,072,832 | 1/1963 | Kilby | 317—235 |
| 3,078,195 | 2/1963 | Tummers et al. | 148—33 |

JOHN W. HUCKERT, *Primary Examiner.*

JAMES D. KALLAM, *Examiner.*

A. S. KATZ, R. SANDLER, *Assistant Examiners.*